(12) United States Patent
Zaka et al.

(10) Patent No.: US 11,610,999 B2
(45) Date of Patent: Mar. 21, 2023

(54) FLOATING-GATE DEVICES IN HIGH VOLTAGE APPLICATIONS

(71) Applicant: GLOBALFOUNDRIES DRESDEN MODULE ONE LIMITED LIABILITY COMPANY & CO. KG, Dresden (DE)

(72) Inventors: Alban Zaka, Dresden (DE); Tom Herrmann, Dresden (DE); Frank Schlaphof, Dresden (DE); Nan Wu, Dresden (DE)

(73) Assignee: GLOBALFOUNDRIES DRESDEN MODULE ONE LIMITED LIABILITY COMPANY & CO. KG, Dresden (DE)

( * ) Notice: Subject to any disclaimer, the term of this patent is extended or adjusted under 35 U.S.C. 154(b) by 0 days.

(21) Appl. No.: 16/897,955

(22) Filed: Jun. 10, 2020

(65) Prior Publication Data

US 2021/0391457 A1 Dec. 16, 2021

(51) Int. Cl.
| | | |
|---|---|---|
| *H01L 29/788* | (2006.01) | |
| *H01L 27/11519* | (2017.01) | |
| *H01L 27/11524* | (2017.01) | |
| *H01L 29/423* | (2006.01) | |
| *H01L 21/28* | (2006.01) | |
| *H01L 29/66* | (2006.01) | |
| *H01L 49/02* | (2006.01) | |

(52) U.S. Cl.
CPC ...... *H01L 29/788* (2013.01); *H01L 27/11519* (2013.01); *H01L 27/11524* (2013.01); *H01L 28/40* (2013.01); *H01L 29/40114* (2019.08); *H01L 29/42324* (2013.01); *H01L 29/66825* (2013.01)

(58) Field of Classification Search
CPC ... H01L 45/04; H01L 45/16; H01L 28/60–75; H01L 28/91; H01L 29/40114; H01L 29/7883; H01L 29/42324; H01L 29/66825; H01L 27/11519; H01L 27/11521; H01L 27/11524; H01L 27/11526; H01L 29/788
See application file for complete search history.

(56) References Cited

U.S. PATENT DOCUMENTS 5,434,812 A * 7/1995 Tseng ................ H01L 27/10817
257/300
5,550,077 A * 8/1996 Tseng ................ H01L 27/10817
257/E21.648

(Continued)

OTHER PUBLICATIONS

W.P. Millard, et al., "Calibration and matching of floating gate devices", IEEE International Symposium on Circuits and Systems (ISCAS), May 2000, 4 pages.

(Continued)

*Primary Examiner* — Maliheh Malek
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to floating-gate devices and methods of manufacture. The structure includes: a gate structure comprising a gate dielectric material and a gate electrode; and a vertically stacked capacitor over and in electrical connection to the gate electrode.

20 Claims, 4 Drawing Sheets

(56) References Cited

U.S. PATENT DOCUMENTS

| | | | | |
|---|---|---|---|---|
| 5,637,523 A * | 6/1997 | Fazan | H01L 27/10817 | 257/E21.008 |
| 5,891,772 A * | 4/1999 | Hsu | H01L 27/10817 | 438/254 |
| 5,903,024 A * | 5/1999 | Hsu | H01L 27/10817 | 257/303 |
| 5,910,667 A * | 6/1999 | Hsu | H01L 27/10817 | 257/306 |
| 5,972,770 A * | 10/1999 | Hsu | H01L 28/91 | 257/E21.016 |
| 5,981,335 A * | 11/1999 | Chi | H01L 29/7885 | 257/E27.103 |
| 5,989,955 A * | 11/1999 | Hsu | H01L 27/10817 | 257/E21.016 |
| 6,146,962 A * | 11/2000 | Kalnitsky | H01L 28/87 | 257/E21.016 |
| 6,168,987 B1 * | 1/2001 | Jeng | H01L 27/10852 | 257/E21.019 |
| 6,259,126 B1 * | 7/2001 | Hsu | G11C 11/005 | 257/298 |
| 6,528,842 B1 * | 3/2003 | Luich | H01L 29/42324 | 257/314 |
| 6,602,749 B2 * | 8/2003 | Tu | H01L 27/10888 | 257/203 |
| 6,614,643 B1 * | 9/2003 | Morita | H01L 28/40 | 257/E21.008 |
| 6,730,950 B1 * | 5/2004 | Seshadri | H01L 21/76895 | 257/295 |
| 6,806,529 B1 * | 10/2004 | Hopper | H01L 29/40114 | 438/257 |
| 7,345,915 B2 * | 3/2008 | Benjamin | G11C 16/0433 | 365/185.26 |
| 7,440,311 B2 * | 10/2008 | Terzioglu | H01L 27/11521 | 365/185.26 |
| 8,076,707 B1 * | 12/2011 | Hyde | H01L 29/7883 | 257/314 |
| 8,169,014 B2 | 5/2012 | Chen et al. | | |
| 8,247,861 B2 * | 8/2012 | Tempel | H01L 23/535 | 257/316 |
| 8,749,022 B2 * | 6/2014 | Chang | H01L 29/94 | 257/532 |
| 8,981,453 B2 * | 3/2015 | Cha | H01L 29/42324 | 257/300 |
| 9,541,521 B1 * | 1/2017 | Hoque | G01N 27/4148 | |
| 9,626,926 B2 * | 4/2017 | Izawa | G09G 3/2022 | |
| 9,905,707 B1 * | 2/2018 | Sidelnicov | H01L 29/66174 | |
| 10,830,731 B1 * | 11/2020 | Cai | G01N 27/4148 | |
| 11,094,699 B1 * | 8/2021 | Brewer | H01L 29/0673 | |
| 2002/0024083 A1 * | 2/2002 | Noble | H01L 27/115 | 257/306 |
| 2003/0107076 A1 * | 6/2003 | Lin | H01L 28/60 | 257/309 |
| 2004/0108539 A1 * | 6/2004 | Kim | H01L 27/11526 | 257/314 |
| 2004/0188777 A1 * | 9/2004 | Hwang | H01L 27/11293 | 257/403 |
| 2005/0082586 A1 * | 4/2005 | Tu | H01L 28/60 | 257/296 |
| 2005/0280061 A1 * | 12/2005 | Lee | H01L 24/83 | 257/296 |
| 2007/0235788 A1 * | 10/2007 | Kao | H01L 27/0629 | 257/303 |
| 2007/0241383 A1 * | 10/2007 | Lin | H01L 27/115 | 257/E27.103 |
| 2008/0054329 A1 * | 3/2008 | Kim | H01L 21/76816 | 257/306 |
| 2008/0054331 A1 | 3/2008 | Chen et al. | | |
| 2009/0020800 A1 * | 1/2009 | Tempel | H01L 29/4916 | 257/E21.409 |
| 2010/0173468 A1 * | 7/2010 | Chen | H01L 28/10 | 438/381 |
| 2010/0283123 A1 * | 11/2010 | Shiu | H01L 27/0658 | 257/532 |
| 2010/0301398 A1 * | 12/2010 | Rothberg | G01N 27/27 | 257/253 |
| 2011/0048769 A1 * | 3/2011 | Fujiwara | H01G 4/1236 | 174/137 B |
| 2011/0217697 A1 * | 9/2011 | Rothberg | B01L 3/502761 | 435/6.1 |
| 2011/0249500 A1 * | 10/2011 | Cha | H01L 29/40114 | 257/E27.084 |
| 2012/0040528 A1 * | 2/2012 | Kim | H01L 21/0338 | 438/675 |
| 2012/0043595 A1 * | 2/2012 | Chang | H01L 29/92 | 257/E29.345 |
| 2012/0228702 A1 * | 9/2012 | Wu | H01L 27/10894 | 257/330 |
| 2012/0265474 A1 * | 10/2012 | Rearick | G16B 30/00 | 702/104 |
| 2013/0161702 A1 * | 6/2013 | Chen | B81C 1/00246 | 257/254 |
| 2014/0152379 A1 * | 6/2014 | Fujimoto | H01L 28/60 | 327/536 |
| 2016/0064510 A1 * | 3/2016 | Mueller | H01L 29/78391 | 257/295 |
| 2016/0133560 A1 * | 5/2016 | Landgraf | H01L 23/5223 | 257/532 |
| 2016/0155737 A1 * | 6/2016 | Linewih | H01L 21/76224 | 361/56 |
| 2016/0190208 A1 * | 6/2016 | Nazarian | G11C 14/0045 | 257/5 |
| 2016/0211386 A1 * | 7/2016 | Tomai | H01L 29/872 | |
| 2016/0268341 A1 * | 9/2016 | Nazarian | H01L 45/1608 | |
| 2017/0025429 A1 * | 1/2017 | Jen | H01L 27/11524 | |
| 2017/0179280 A1 * | 6/2017 | Yadav | H01L 29/1095 | |
| 2017/0236839 A1 * | 8/2017 | Yamazaki | H01L 21/02271 | 257/43 |
| 2018/0175241 A1 * | 6/2018 | Jain | H01L 29/40114 | |
| 2019/0164982 A1 * | 5/2019 | Lu | H01L 27/108 | |
| 2019/0229122 A1 * | 7/2019 | Cai | H01L 27/11531 | |
| 2019/0289239 A1 * | 9/2019 | Gomi | H01L 27/146 | |
| 2019/0393298 A1 * | 12/2019 | Lin | H01L 28/75 | |
| 2020/0006346 A1 * | 1/2020 | Avci | H01L 23/5223 | |
| 2020/0111866 A1 * | 4/2020 | Marzaki | H01L 21/283 | |
| 2020/0203995 A1 * | 6/2020 | Osada | H02J 50/402 | |
| 2020/0279803 A1 * | 9/2020 | Wei | H01L 21/76816 | |
| 2020/0286986 A1 * | 9/2020 | Marzaki | H01L 28/87 | |
| 2020/0328277 A1 * | 10/2020 | Jain | H01L 27/1104 | |
| 2020/0335578 A1 * | 10/2020 | Cheng | H01L 29/42372 | |
| 2020/0395341 A1 * | 12/2020 | Maejima | H01L 27/11573 | |
| 2020/0395434 A1 * | 12/2020 | Jeon | H01L 51/56 | |
| 2021/0083043 A1 * | 3/2021 | Mao | H01L 28/75 | |
| 2021/0159234 A1 * | 5/2021 | Wang | H01L 29/42324 | |
| 2021/0193692 A1 * | 6/2021 | Lim | H01L 27/0629 | |
| 2021/0305265 A1 * | 9/2021 | Tian | H01L 27/11531 | |
| 2021/0375895 A1 * | 12/2021 | Sun | H01L 29/42332 | |

OTHER PUBLICATIONS

T. Shibata, et al.,"A functional MOS transistor featuring gate-level weighted sum and threshold operations", IEEE Transactions on Electron Devices ( vol. 39 , Issue: 6 , Jun. 1992 ), 12 pages.

W.P. Millard, et al.,"Calibration and matching of floating gate devices", IEEE International Symposium on Circuits and Systems (ISCAS), May 2000, 1 page.

T. Shibata, et al.,"A functional MOS transistor featuring gate-level weighted sum and threshold operations", IEEE Transactions on Electron Devices ( vol. 39 , Issue: 6 , Jun. 1992 ), 1 page.

Unknown, "Four-Channel LCD Backlight Driver With Integrated Bias Power", 2016-2018, Texas Instruments Incorporated, 83 pages.

* cited by examiner

FLOATING-GATE DEVICES IN HIGH VOLTAGE APPLICATIONS

FIELD OF THE INVENTION

The present disclosure relates to semiconductor structures and, more particularly, to floating-gate devices and methods of manufacture.

BACKGROUND

High-voltage semiconductor devices are used in a wide variety of applications. These applications include, e.g., non-volatile memory devices. The electronic devices utilizing non-volatile memory are decreasing in size while requiring an increased amount of non-volatile data storage capacity.

Non-volatile memory cells can be formed using a "double-poly" structure, in which a control gate and a floating gate are each formed in a separate polycrystalline silicon (also referred to as polysilicon) layer. However, double-poly processes are expensive due to the additional manufacturing steps required to form the multiple polysilicon layers. Alternatively, memory cells can be fabricated by providing a very thick gate oxide, e.g., on the order of 820 Å or greater, compared to 600 Å in conventional devices. However, the fabrication of a thicker gate oxide is also a time consuming and expensive process.

In another non-volatile memory cell, the gate of a transistor, which acts as a floating gate, is coupled to a capacitor, which acts as a control gate. These memory cells consume a very large amount of the semiconductor surface area since the capacitors must be implemented in the semiconductor substrate and laid out laterally to the transistors. Non-volatile memory cells with capacitors also require minimum spacing requirements that add to the consumption of the semiconductor area.

SUMMARY

In an aspect of the disclosure, a structure comprises: a gate structure comprising a gate dielectric material and a gate electrode; and a vertically stacked capacitor over and in electrical connection to the gate electrode.

In an aspect of the disclosure, a structure comprises: a substrate; a floating gate structure on the substrate and comprising a gate dielectric material and a gate electrode; and a vertically stacked capacitor over the floating gate structure which has a same or smaller footprint than the floating gate structure.

In an aspect of the disclosure, a method comprises: forming a gate structure on a substrate; and forming a capacitor vertically over and in electrically connection to the gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to floating-gate devices and methods of manufacture. More specifically, the present disclosure relates to floating-gate devices used in high-voltage applications, e.g., 25 V+. In embodiments, the floating-gate device includes a gate structure with a vertical stacked capacitor on top of the gate structure. Advantageously, the present disclosure enables a high voltage application, e.g., 25 V+ device, at the gate stack without modification of the gate dielectric of the gate stack. The floating-gate device also does not have an increased footprint, and further reduces the complexity of the gate fabrication processes.

In embodiments, a voltage divider (e.g., backend of line (BEOL) capacitor) is vertically stacked on top of gate electrode of a field effect transistor (FET) formed upon a substrate. Preferably the BEOL capacitor is formed within a footprint of the gate electrode, although it is also contemplated that the BEOL capacitor could extend beyond the footprint of the gate electrode. In implementation, the BEOL capacitor (i.e., voltage divider) can control voltage applied to the gate electrode of the FET through capacitive coupling with the gate electrode. For example, by coupling connections of the BEOL capacitor directly to the gate electrode of the FET and, in embodiments, maintaining some floating connections, it is possible to control the voltage applied to the gate electrode of the FET.

The floating-gate devices of the present disclosure can be manufactured in a number of ways using a number of different tools. In general, though, the methodologies and tools are used to form structures with dimensions in the micrometer and nanometer scale. The methodologies, i.e., technologies, employed to manufacture the floating-gate devices of the present disclosure have been adopted from integrated circuit (IC) technology. For example, the structures are built on wafers and are realized in films of material patterned by photolithographic processes on the top of a wafer. In particular, the fabrication of the floating-gate devices uses three basic building blocks: (i) deposition of thin films of material on a substrate, (ii) applying a patterned mask on top of the films by photolithographic imaging, and (iii) etching the films selectively to the mask.

Figure 1:
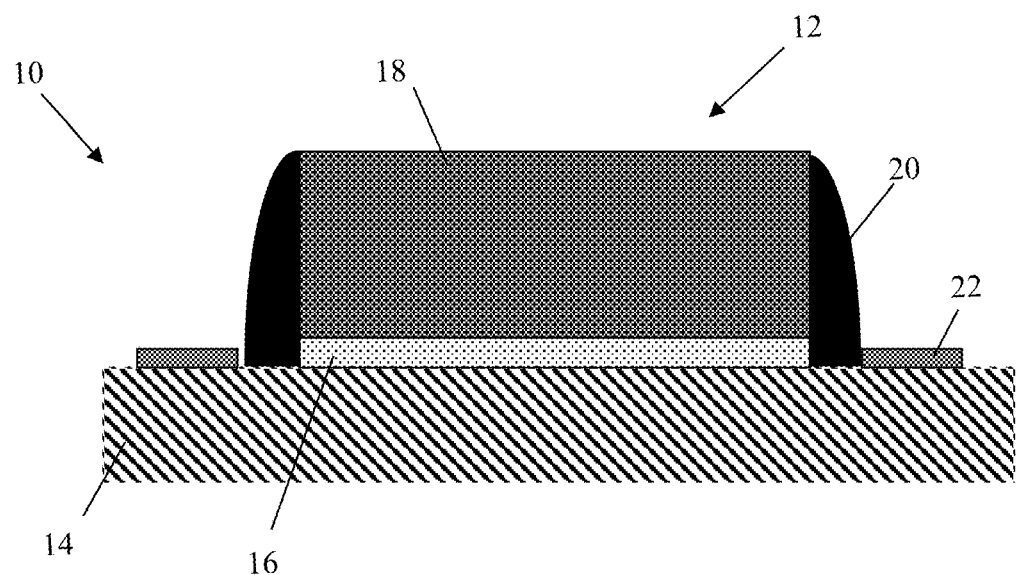
FIG. 1 shows a gate structure and respective fabrication processes in accordance with aspects of the present disclosure.

FIG. 1 shows a gate structure and respective fabrication processes in accordance with aspects of the present disclosure. More specifically, the structure 10 shown in FIG. 1 includes a gate structure 12 formed on a substrate 14. In embodiments, the substrate 14 can be any appropriate semiconductor material. For example, the substrate 14 may be composed of any suitable material including, but not limited to, Si, SiGe, SiGeC, SiC, GaAs, InAs, InP, and other III/V or II/VI compound semiconductors. Moreover, the substrate 14 can be representative of a single semiconducting material such as bulk silicon. Alternatively, the substrate may comprise semiconductor-on-insulator (SOI) technologies as is known in the art such that no further explanation is required for a complete understanding of the present disclosure.

Still referring to FIG. 1, the gate structure 12 includes a gate dielectric material 16 and a gate electrode 18. In embodiments, the gate dielectric material 16 can be a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate dielectric material 16 can have a thickness of about 200 Å or greater; although other thicknesses are also contemplated herein. The gate electrode 18 can be, e.g., poly material.

In embodiments, the gate dielectric material 16 and the gate electrode 18 are formed by conventional deposition, lithography and etching processes. For example, the gate dielectric material 16 can be deposited by a conventional atomic layer deposition (ALD) process or a plasma enhanced chemical vapor deposition (PECVD) process, as examples. The gate electrode 18 can be formed by a CVD deposition process of poly material on the gate dielectric material 16. Following the deposition processes, the materials of the gate dielectric material 16 and the gate electrode 18 are patterned using conventional lithography and etching processes such that no further explanation is required for a complete understanding of the present disclosure. Sidewall spacers 20 are formed on the gate structure 12 by conventional deposition processes, followed by an anisotropic etching process. The sidewalls spacers 20 can be, e.g., nitride material.

FIG. 1 further shows source and drain regions 22 formed by conventional ion implantation processes or a doped epitaxial growth process to formed raised source and drain regions 22. For example, in the epitaxial growth process, epitaxy regions (source/drain regions) are formed by selectively growing a semiconductor material on the substrate 14. Although not shown, the substrate 14 can include wells formed by introducing a dopant by, for example, ion implantation that introduces a concentration of a dopant in the substrate 14. A P-well is doped with p-type dopants, e.g., Boron (B), and the N-well is doped with n-type dopants, e.g., Arsenic (As), Phosphorus (P) and Sb, among other suitable examples.

Figure 2:
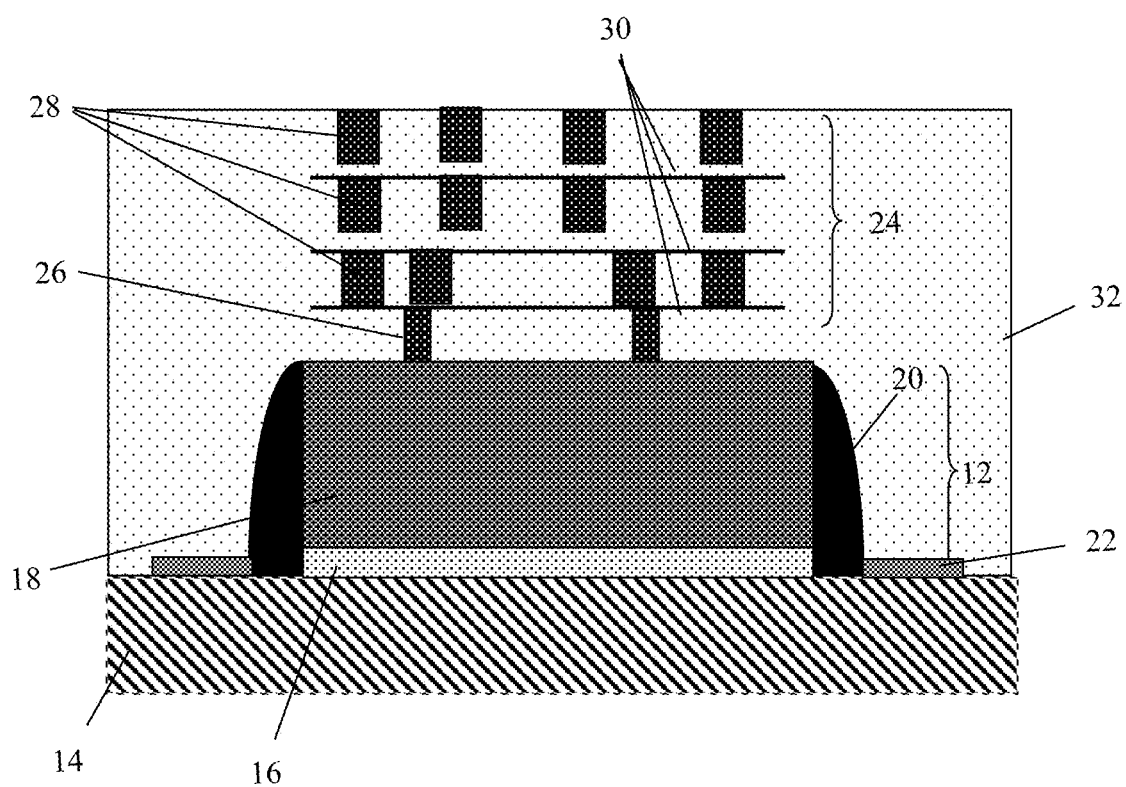
FIG. 2 shows a voltage divider stacked on the gate structure and respective fabrication processes in accordance with aspects of the present disclosure.

FIG. 2 shows a voltage divider 24 vertically stacked on the gate structure 12 and respective fabrication processes. More specifically, the voltage divider 24 is a BEOL capacitor stacked vertically on the gate structure 12. As shown in FIG. 2, the BEOL capacitor 24 does not increase the footprint of the device, e.g., gate structure 12, as it is positioned vertically above gate structure 12; that is, the BEOL capacitor 24 can have the same or a smaller footprint than the gate structure 12. In one non-limiting exemplary embodiment, the BEOL capacitor 24 can be a metal-oxide-metal (MOM) capacitor or an alternate polarity metal-oxide-metal (APMOM) capacitor. In the latter scenario, the wiring 28 on a same wiring level will alternate between positive and negative.

The BEOL capacitor 24 can include one or more layers of wiring 28, depending on the design parameters. For example, an increase in the number layers of wiring 28 will increase the capacitance; whereas, a decrease in the layer of wiring 28 will decrease the capacitance. Moreover, the spacing between wirings 28 on the same level or layer or different levels or the dimensions of the wirings 28 can be adjusted to increase or decrease capacitive density. For example, the use of five metal layers with an application of 8V will result in a 1:4 capacitance-coupling, extending an existing 20V high voltage (HV) gate oxide into a 25V HV application. Similarly, the use of three metal layers with an application of 12V will result in a 1:1.67 capacitance-coupling, extending an existing 20V high voltage (HV) gate oxide into a 32V HV application. More detailed examples are provided below.

The BEOL capacitor 24 is coupled to the gate electrode 18 of the gate structure 12 by wiring or interconnect structures 26. For example, at least one or more wiring 28 of the BEOL capacitor 24 is directly connected to the gate electrode 18 by the wiring or interconnect structures 26. In this way, upon an application of voltage, the gate structure 12 becomes a floating node (e.g., floating-gate device). Moreover, the one or more layers of wiring 28 can be separated, optionally, by a nitride layer 30. The BEOL capacitor 24 and the wiring or via structure 26 are formed within dielectric material 32. In embodiments, the dielectric material 32 is interlevel dielectric material comprising, e.g., $SiO_2$. Moreover, a ratio of the thickness of the gate dielectric material 16 to a thickness of back end of line dielectric material, e.g., dielectric material 32, can be 1:1 to 1:4, as an example.

The BEOL capacitor 24, e.g., wiring structures and interconnect structures, can be formed with the same footprint or smaller as the gate structure 12 using conventional lithography, etching and deposition methods known to those of skill in the art. For example, a resist formed over a layer of the dielectric material 32 is exposed to energy (light) to form a pattern (opening). An etching process with a selective chemistry, e.g., reactive ion etching (RIE), will be used to form one or more trenches in the dielectric material 32 through the openings of the resist. Following removal by the resist by a conventional oxygen ashing process or other known stripants, conductive material can be deposited by any conventional deposition processes, e.g., chemical vapor deposition (CVD) processes. Prior to forming a next layer, any residual material on the surface of the insulator material can be removed by conventional chemical mechanical polishing (CMP) processes, followed by an optional deposition of the nitride material 30. This process can continue to form the number of desired layers of wiring 28. Accordingly, although three layers of wiring 28 are shown in FIG. 2, any number of wiring layers are contemplated herein depending on the design parameters, e.g., coupling capacitance, required voltage at the gate oxide, etc.

Figure 3:
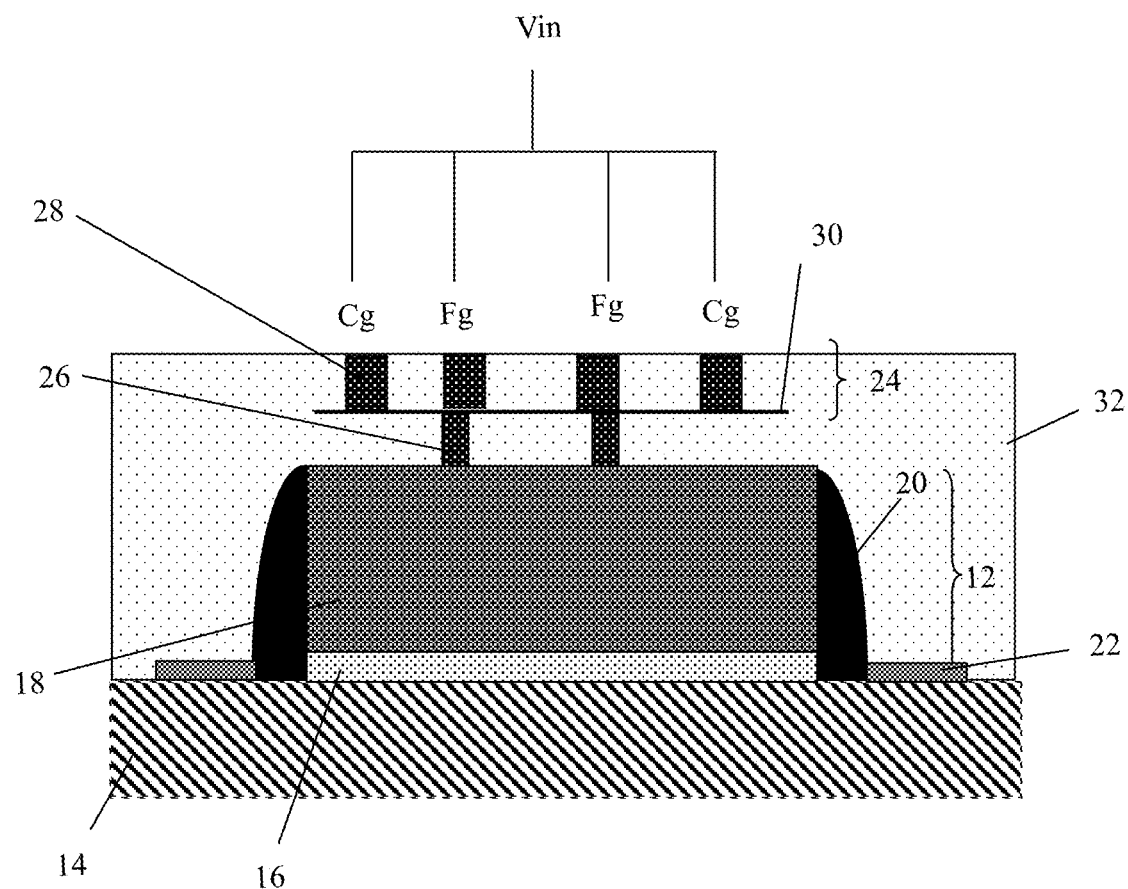
FIG. 3 shows a representation of a floating gate voltage (fg) and an input control gate (Cg) in accordance with aspects of the present disclosure.

In embodiments, the floating gate voltage (fg) is controlled by capacitive coupling to the interconnect structures 26 and the input control gate (Cg) as representative shown in FIG. 3. The coupling ratio can be designed by proper choice of the BEOL capacitor 24 (MOM or APMOM), e.g., spacing and number and dimensions of different wirings, with the initial charges in the floating gate voltage being evacuated with a final anneal (e.g., 400° C.) in the BEOL structure. For example, the capacitive coupling is controlled through the various terminals (e.g., wirings 28) without any effective charge transfer taking place through dielectrics (i.e., tunneling) from the gate structure 12, e.g., floating gate, to either the substrate 14 or other wirings 28 contacting the gate electrode (e.g., polysilicon) 18. In this way, the Vth of the device is modulated by the amount of charges built-up in the floating gate 12 by capacitive coupling. And making use of the BEOL capacitor 24 to control the voltage division by accurate capacitive coupling, it is now possible to enable higher input voltages (e.g., 25V/30V).

Figure 4:
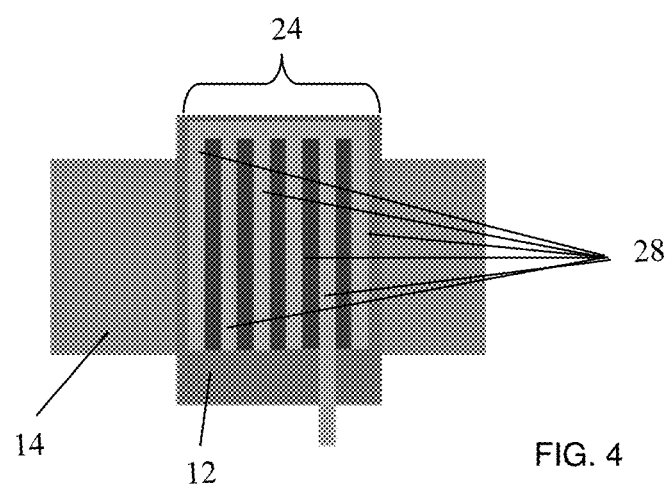
FIG. 4 shows a top view of the voltage divider stacked on the gate structure in accordance with aspects of the present disclosure.

FIG. 4 shows a top view of the voltage divider stacked on the gate structure in accordance with aspects of the present disclosure. The voltage divider 24, e.g., BEOL capacitor, comprises a plurality of wirings 28 configured as fingers. The BEOL capacitor 24 is also shown to be vertically stacked on the gate structure 12, e.g., over the gate electrode, and to have a same or smaller footprint than the gate structure 12. Moreover, the BEOL capacitor 24 includes two degrees of freedom: (i) spacing between horizontal metal lines and the metal line thickness, itself; and (ii) the number of metal layers.

Table 1, below, provides examples of different applications, e.g., input voltage of 25V and 30V, which implement the BEOL capacitors described herein.

TABLE 1

$C_{HV\_GOX}$~0.6 fF/um2

| Input | Voltage at gate (Vgate) | $\alpha_{fg\text{-}Cg}$ | Capacitance ($C_{APMOM}$) | Capacitor Layout (APMOM) |
|---|---|---|---|---|
| 25 V | 20 V | 0.8 | 4 × $C_{GOX}$ = 2.4 fF/um2 | 5 wiring layers: 80 nm spacing between wirings on same layer/80 nm wiring layer thickness |
| 30 V | 20 V | 0.666 | 2 × $C_{GOX}$ = 1.2 fF/um2 | 5 wiring layers/3 wiring layers: 100 nm spacing between wirings on same layer/100 nm wiring layer thickness |

Figure 5:
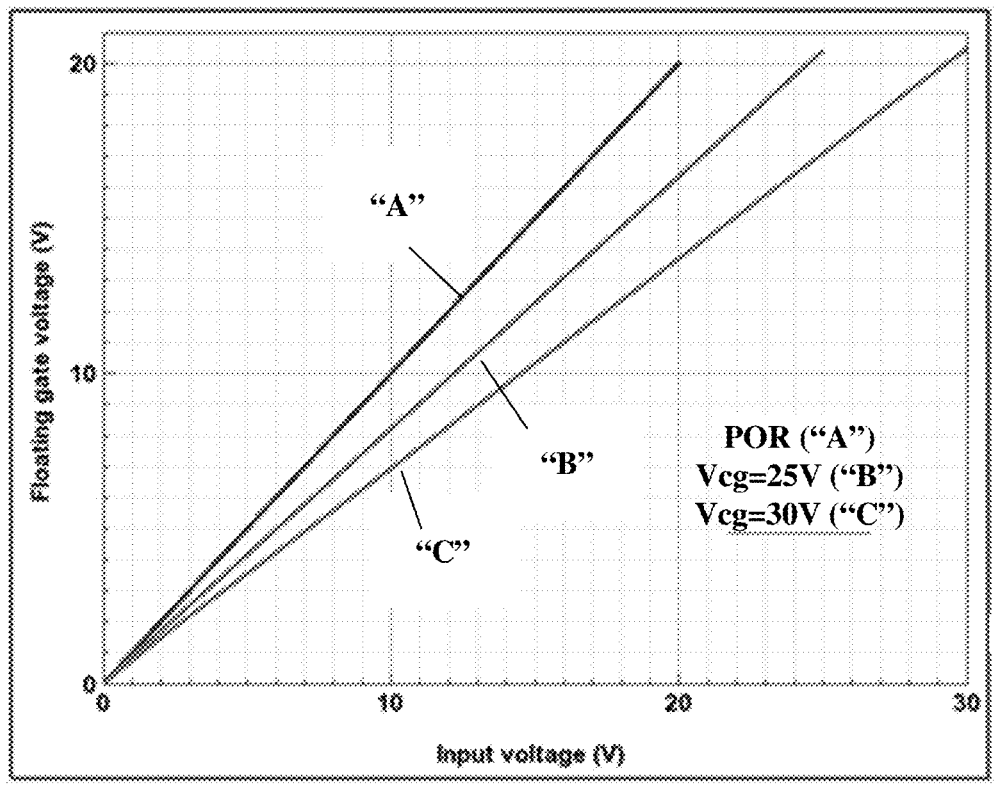
FIGS. 5-7 show graphs comparing the voltage divider stacked on the gate structure to a conventional gate electrode.
Figure 6:
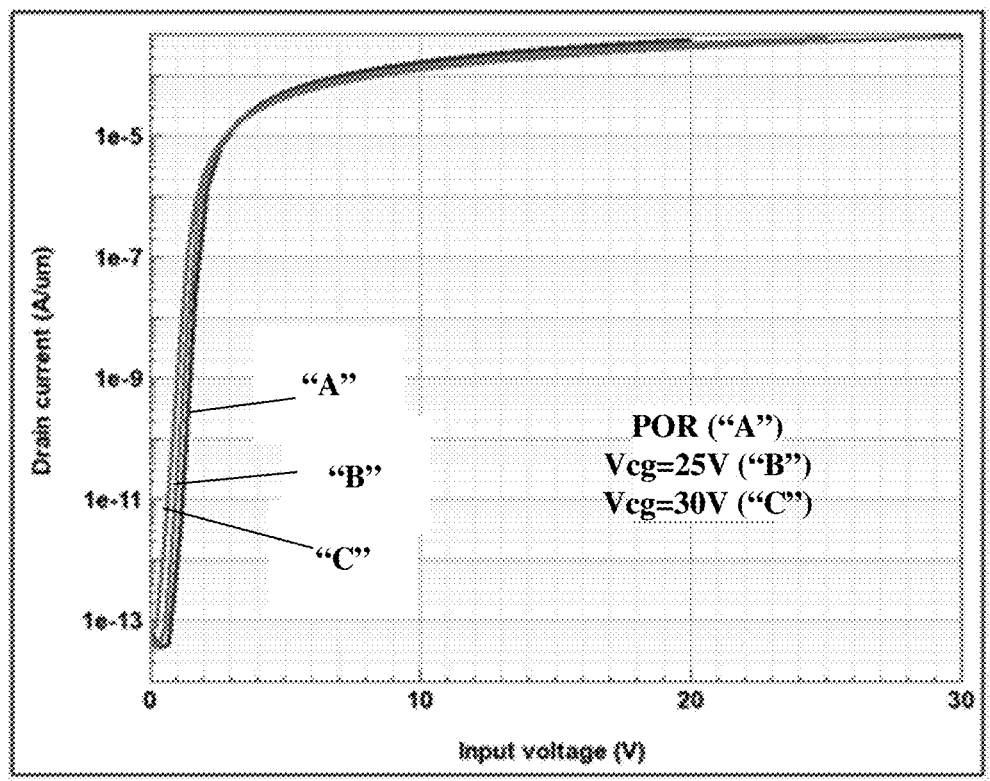
Figure 7:
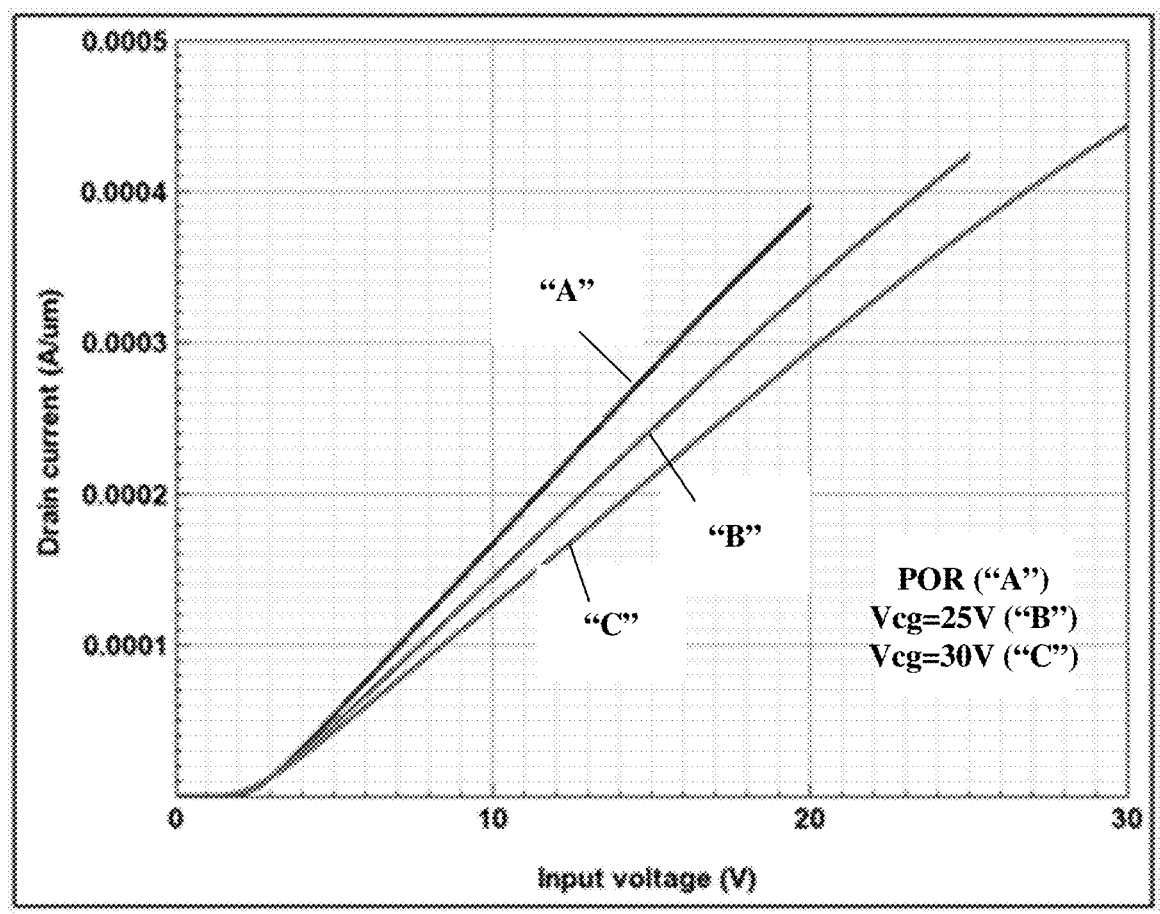

FIGS. 5-7 show graphs comparing the examples in Table 1 (e.g., a gate device with a gate dielectric thickness of 600 Å, in combination with the BEOL capacitor described in the present disclosure). More specifically, FIG. 5 shows a graph with the X-axis representing input voltage (V) and the Y-axis representing a floating gate voltage (V). As shown in this graph, each of the examples "B" and "C" as represented in Table 1 and the conventional device "A" provide a floating gate voltage of approximately 20V. This shows that the dimensions and utilization of the capacitor layout shown in the above example will yield the desired gate voltage at the HV transistor, e.g., gate oxide 16 of the device 12.

FIGS. 6 and 7 each show a graph with the X-axis representing input voltage (V) and the Y-axis representing drain current (A/µm). As shown in the graph of FIG. 6, each of the examples "B" and "C" as represented in Table 1 and the conventional device "A" have similar switching properties. On the other hand, as shown in FIG. 7, each of the examples "B" and "C" as represented in Table 1 and the conventional device "A" will have similar drain currents. This, accordingly, shows that the Idsat for the examples "B" and "C" are almost unchanged to the conventional device "A".

The floating-gate devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a gate structure comprising a gate dielectric material and a gate electrode; and
   a vertically stacked capacitor over and in electrical connection to the gate electrode,
   wherein the vertically stacked capacitor comprises multiple wirings on each of one or more wiring layers in electrical connection to the gate electrode,
   the multiple wirings on the one or more wiring layers comprise multiple fingers on a same wiring layer,
   the one or more wiring layers comprise multiple wiring layers,
   each of the multiple fingers on the same wiring layer are separated by interlevel dielectric material,
   each of the multiple fingers on the multiple wiring layers on the same wiring layer are separated by insulator material,
   at least one interconnect is directly connecting the vertically stacked capacitor to the gate electrode, and
   the at least one interconnect is provided within the interlevel dielectric material.

2. The structure of claim 1, wherein the vertically stacked capacitor over the gate electrode includes multiple wiring layers each of which comprises multiple wirings separated by dielectric material on a same wiring level.

3. The structure of claim 2, wherein the vertically stacked capacitor is electrically connected to the gate electrode by interconnects and the multiple wiring layers are spaced apart from one another on the same wiring layer by the dielectric material and separated by an insulator material between wiring layers of the multiple wiring layers.

4. The structure of claim 2, wherein the gate dielectric material has a thickness of from 200 Å and greater, and a ratio of the thickness of the gate dielectric material to a thickness of back end of line dielectric material is 1:1 to 1:4.

5. The structure of claim 2, wherein the vertically stacked capacitor has a same footprint as the gate structure and the multiple wirings are configured as fingers.

6. The structure of claim 2, wherein the vertically stacked capacitor has a footprint smaller than the gate structure.

7. The structure of claim 2, wherein the gate structure is a floating gate device.

8. The structure of claim 7, wherein the vertically stacked capacitor includes both a floating gate voltage (fg) and a control gate voltage applied through the vertically stacked capacitor.

9. The structure of claim 8, wherein the vertically stacked capacitor provides capacitive coupling controlled through various wirings of the vertically stacked capacitor, which induces charge transfer from the gate structure to a either substrate or terminals contacting the gate electrode.

10. The structure of claim 2, wherein the vertically stacked capacitor is a metal-oxide-metal (MOM) capacitor.

11. The structure of claim 2, wherein the vertically stacked capacitor is an alternate polarity metal-oxide-metal (APMOM) capacitor comprising wiring on a same wiring level alternating between positive and negative.

12. A structure comprising:
a substrate;
a floating gate structure on the substrate and comprising a gate dielectric material and a gate electrode;
a vertically stacked capacitor over the floating gate structure confined within the edges of the floating gate structure and which comprises multiple wirings on each of one or more wiring layers in electrical connection to the gate electrode of the floating gate structure, the multiple wirings comprise multiple fingers on a same wiring layer, wherein each of the multiple fingers on the same wiring layer are separated by interlevel dielectric material; and
a plurality of interconnect structures connecting the vertically stacked capacitor to the gate electrode, at least one interconnect is directly connecting the vertically stacked capacitor to the gate electrode, and the at least one interconnect is provided within the interlevel dielectric material.

13. The structure of claim 12, wherein the vertically stacked capacitor includes multiple vertically stacked wiring layers separated by a nitride material, and each of the multiple vertically stacked wiring layers includes the multiple wirings comprising the multiple fingers separated from one another by the interlevel dielectric material.

14. The structure of claim 12, wherein the gate dielectric material has a thickness of from 200 Å and greater, and a ratio of the thickness of the gate dielectric material to a thickness of back end of line dielectric material is 1:1 to 1:4.

15. The structure of claim 12, wherein the vertically stacked capacitor includes both a floating gate voltage (fg) and a control gate voltage applied through the vertically stacked capacitor and the multiple wirings of the vertically stacked capacitor comprise multiple wiring fingers.

16. The structure of claim 12, wherein the vertically stacked capacitor provides capacitive coupling controlled through various wirings of the vertically stacked capacitor, which induces charge transfer from the gate structure to a either substrate or terminals contacting the gate electrode.

17. The structure of claim 12, wherein the vertically stacked capacitor is a metal-oxide-metal (MOM) capacitor.

18. The structure of claim 12, wherein the vertically stacked capacitor is an alternate polarity metal-oxide-metal (APMOM) capacitor comprising wiring on a same wiring level alternating between positive and negative.

19. A method comprising:
forming a gate structure on a substrate, the forming of the gate structure comprises:
forming a gate dielectric material on the substrate;
forming a gate electrode material on the gate dielectric;
patterning the gate dielectric material and the gate electrode material; and
forming sidewall spacers on sidewalls of the patterned gate dielectric material and the patterned gate electrode material; and
forming a capacitor of multiple wirings vertically over and in electrically connection to the gate structure, wherein the forming of the capacitor comprises:
forming dielectric material over the gate structure;
forming multiple trenches within the dielectric material, wherein each trench of the multiple trenches is separated by the dielectric material; and
forming conductive material within the multiple trenches to form the multiple wirings on a same layer of the dielectric material; and
forming at least one interconnect connecting the gate structure to the capacitor.

20. The structure of claim 12, wherein the vertically stacked capacitor comprises the multiple wirings on multiple wiring layers, each of the multiple wirings comprise multiple fingers separated by the interlevel dielectric material on a same wiring layer and on different wring layers, and each of the multiple wirings is confined within the edges of the floating gate structure and has one of a same and smaller footprint than the floating gate structure.

* * * * *